(12) United States Patent
Fujii et al.

(10) Patent No.: US 10,119,821 B2
(45) Date of Patent: *Nov. 6, 2018

(54) ANGULAR VELOCITY SENSOR

(71) Applicant: Panasonic Intellectual Property Management Co., Ltd., Osaka (JP)

(72) Inventors: Tsuyoshi Fujii, Osaka (JP); Kensaku Yamamoto, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 153 days.

This patent is subject to a terminal disclaimer.

(21) Appl. No.: 15/058,374

(22) Filed: Mar. 2, 2016

(65) Prior Publication Data

US 2016/0195395 A1 Jul. 7, 2016

Related U.S. Application Data

(63) Continuation of application No. 13/989,644, filed as application No. PCT/JP2011/007190 on Dec. 22, 2011, now Pat. No. 9,303,993.

(30) Foreign Application Priority Data

Dec. 28, 2010 (JP) .................. 2010-291931

(51) Int. Cl.
 *G01C 19/56* (2012.01)
 *G01C 19/574* (2012.01)
 (Continued)

(52) U.S. Cl.
 CPC ......... *G01C 19/5719* (2013.01); *G01C 19/56* (2013.01); *G01C 19/5607* (2013.01); *G01C 19/574* (2013.01); *H01L 41/1132* (2013.01)

(58) Field of Classification Search
 CPC .. G01C 19/5719; G01C 19/56; G01C 19/574; G01C 19/5607; G01C 19/5642
 See application file for complete search history.

(56) References Cited

U.S. PATENT DOCUMENTS

| 9,303,993 B2 * | 4/2016 | Fujii ................. G01C 19/5719 |
| 2009/0064783 A1 * | 3/2009 | Ohuchi .............. G01C 19/5607 |
| | | 73/514.15 |

(Continued)

FOREIGN PATENT DOCUMENTS

| JP | 9-014972 A | 1/1997 |
| JP | 2001-082963 A | 3/2001 |

(Continued)

OTHER PUBLICATIONS

International Search Report for PCT/JP2011/007190 dated Feb. 14, 2012.

*Primary Examiner* — Helen Kwok
(74) *Attorney, Agent, or Firm* — Pearne & Gordon LLP

(57) ABSTRACT

A sensor includes a sensor element, defined in an XY plane, including a first member, a second member having a first portion extending from the first member in a positive Y axis direction, a second portion extending from the first portion in a positive X axis direction and a third portion extending from the second portion in a negative Y axis direction, and a third member having a first section and a second section having a rectangular shape in a top view respectively. The first portion, the second portion and the third portion extend along a periphery of the first section in the top view respectively. The second section is connected to the third portion and extends from the first section in a positive Y axis direction. A length of the second member is larger than a length of the third member in a positive X axis direction.

21 Claims, 10 Drawing Sheets

(51) Int. Cl.
  *G01C 19/5719* (2012.01)
  *G01C 19/5607* (2012.01)
  *H01L 41/113* (2006.01)

(56) References Cited

U.S. PATENT DOCUMENTS

| | | | |
|---|---|---|---|
| 2009/0158847 A1 | 6/2009 | Fujiyoshi et al. | |
| 2009/0266163 A1* | 10/2009 | Ohuchi | G01C 19/5719 73/504.12 |
| 2009/0320594 A1* | 12/2009 | Ohuchi | G01C 19/574 73/504.16 |
| 2010/0071468 A1* | 3/2010 | Ohuchi | G01C 19/5719 73/504.12 |
| 2010/0126270 A1* | 5/2010 | Terada | G01C 19/5719 73/504.12 |
| 2010/0199761 A1 | 8/2010 | Uemura | |
| 2010/0229645 A1 | 9/2010 | Aizawa et al. | |
| 2011/0179869 A1 | 7/2011 | Kobayashi et al. | |
| 2011/0203371 A1 | 8/2011 | Ohuchi et al. | |
| 2011/0265567 A1 | 11/2011 | Uemura | |
| 2012/0227489 A1 | 9/2012 | Imanaka et al. | |
| 2013/0239681 A1 | 9/2013 | Fujii et al. | |
| 2014/0283602 A1 | 9/2014 | Yamamoto | |
| 2015/0204897 A1 | 7/2015 | Yamamoto | |

FOREIGN PATENT DOCUMENTS

| | | |
|---|---|---|
| JP | 2003-344442 A | 12/2003 |
| JP | 2007-108044 | 4/2007 |
| JP | 2008-046058 | 2/2008 |
| JP | 2009-128020 | 6/2009 |
| JP | 2009-150815 A | 7/2009 |
| JP | 2009-175511 A | 8/2009 |
| WO | 2007/111289 A1 | 10/2007 |
| WO | 2008/023653 A1 | 2/2008 |
| WO | WO 2008/023653 * | 2/2008 |
| WO | 2010/092806 A1 | 8/2010 |

* cited by examiner

ANGULAR VELOCITY SENSOR

TECHNICAL FIELD

The present invention relates to angular velocity sensors used in, e.g. portable terminals and automobiles.

BACKGROUND ART

FIG. 11 is a top view of sensor element 101 of a conventional angular velocity sensor. Sensor element 101 includes support body 102 extending in a direction of an X axis in an XYZ space, arm 103 having one end 103A connected with support body 102, and weight 199 connected to another end 103D of arm 103. One end 103A of arm 103 is connected to a side surface of support body 102. Arm 103 has a J-shape having corners 103B and 103C. Weight 199 is driven to vibrate in an X-Y plane.

A conventional angular velocity sensor similar to the angular velocity sensor including sensor element 101 is disclosed in, e.g. Patent Literature 1.

In sensor element 101, it may be difficult to improve a detection sensitivity of angular velocity about a Z axis.

CITATION LIST

Patent Literature

PTL1: Japanese Patent Laid-Open Publication No. 2008-46058

SUMMARY

A sensor includes a sensor element defined in an XY plane having an X axis and a Y axis that is orthogonal to the X axis. The sensor element includes a first member, a second member consisting of a first portion extending from the first member in a positive direction of the Y axis, a second portion extending from the first portion in a positive direction of the X axis and a third portion extending from the second portion in a negative direction of the Y axis, and a third member consisting of a first section and a second section having a rectangular shape in a top view respectively. The first portion, the second portion and the third portion extend along a periphery of the first section in the top view respectively. The second section is connected to the third portion and extends from the first section in a positive direction of the Y axis. A length of the second member is larger than a length of the third member in a positive direction of the X axis.

DETAIL DESCRIPTION OF PREFERRED EMBODIMENTS

Exemplary Embodiment 1

Figure 1:
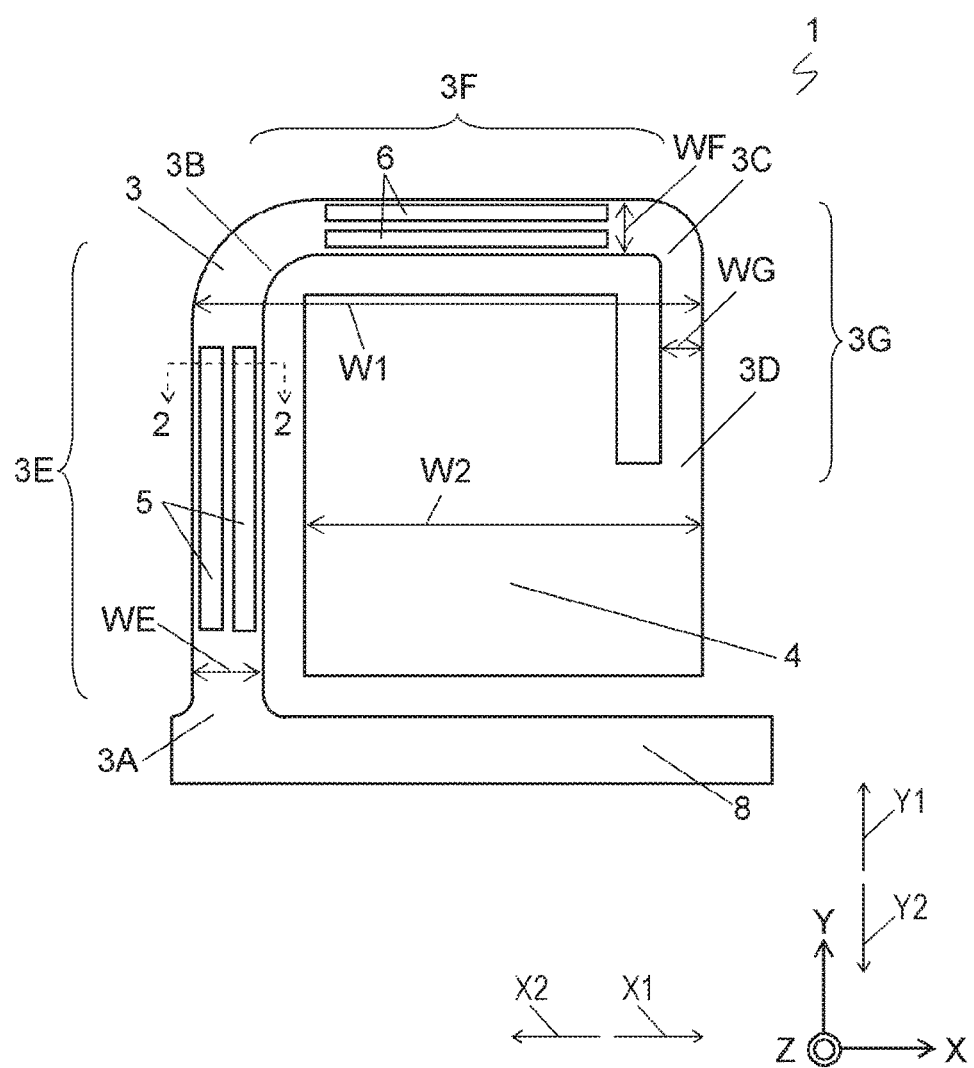
FIG. 1 is a top view of a sensor element of an angular velocity sensor according to Exemplary Embodiment 1 of the present invention.

FIG. 1 is a top view of sensor element 1 of an angular velocity sensor according to Exemplary Embodiment 1. In FIG. 1, an X axis, a Y axis and a Z axis orthogonal to one another are defined. The angular velocity sensor includes sensor element 1 for detecting an angular velocity about the Z axis. Sensor element 1 has a shape defined in an XYZ space. Sensor element 1 includes support body 8 extending in a direction of the X axis, arm 3 having end 3A connected with a side surface of support body 8, and weight 4 connected with end 3D of arm 3 opposite to end 3A of arm 3. Arm 3 has substantially a J-shape including corners 3B and 3C. Length W1 of arm 3 in the direction of the X axis is larger than length W2 of weight 4 in the direction of the X axis.

The angular velocity sensor according to Embodiment 1 can improve a sensitivity of detecting an angular velocity about the Z axis of sensor element 1 since a resonance frequency of driving vibration of sensor element 1 can be close to a resonance frequency of detection vibration of the angular velocity about the Z axis.

Figure 11:
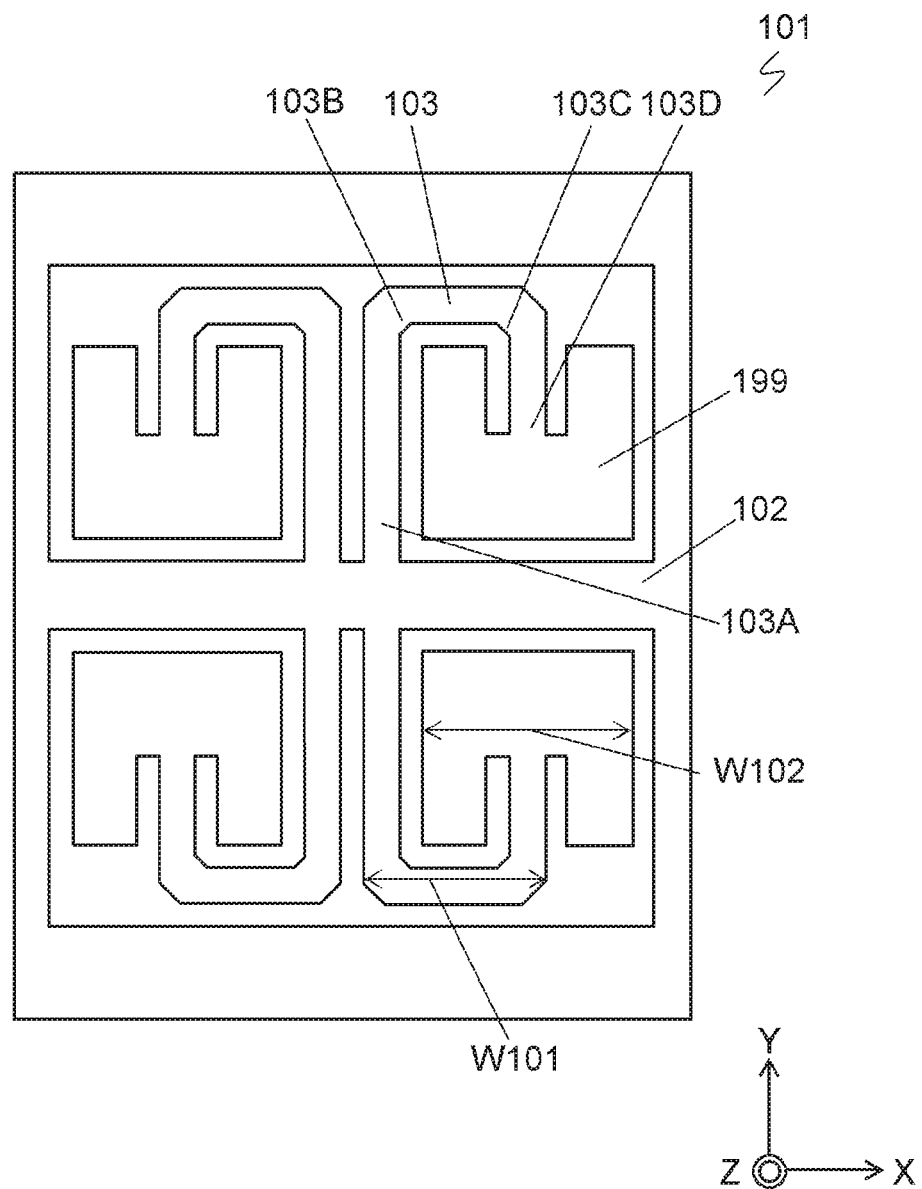
FIG. 11 is a top view of a sensor element of a conventional angular velocity sensor.

In conventional sensor element 101 shown in FIG. 11, length W101 of arm 103 in the direction of the X axis is smaller than length W102 of weight 199 in the direction of the X axis. The inventors found that it is difficult in this case to improve the sensitivity of detecting angular velocity about the Z axis of sensor element 101 since a resonance frequency of driving vibration of sensor element 101 is much different from a resonance frequency of detection vibration when the angular velocity about the Z axis is applied to sensor element 101.

The structure of sensor element 1 of the angular velocity sensor according to Embodiment 1 will be detailed below.

Support body 8 is a fixing member that supports sensor element 1. Support body 8 is fixed to a package for storing sensor element 1 with, e.g. another supporting member of adhesive.

Arm 3 extends from end 3A connected with a side surface of support body 8 to end 3D connected with weight 4. To be more specific, arm 3 has substantially a J-shape including arm portion 3E extending in a positive direction Y1 of the Y axis from end 3A to corner 3B, arm portion 3F extending in a positive direction X1 of the X axis from corner 3B to corner 3C, and arm portion 3G extending in a negative direction Y2 of the Y axis from corner 3C to end 3D. Arm 3 and weight 4 can be driven to vibrate in an X-Y plane including the X axis and the Y axis, and can warp in the direction of the Z axis.

Support body 8, arm 3 and weight 4 may be made of a piezoelectric material, such as crystal, $LiTaO_3$, or $LiNbO_3$, or a non-piezoelectric material, such as silicon, diamond, fused quartz, alumina, or GaAs. In the case that they are made of silicon, in particular, sensor element 1 may have a very small size by a micromachining technique, and can be integrated with an IC that composes peripheral circuits.

Support body 8, arm 3, and weight 4 may be formed individually with different materials or a material of the same kind so that they can be assembled together afterward. Alternatively, they may be made unitarily of a single material. Sensor element 1 can be manufactured efficiently if support body 8, arm 3, and weight 4 are made unitary of a single material since they can be formed by a single process, such as dry etching or wet etching.

Each of two driving parts 5 is located on respective one of an inner side and an outer side of the J-shape of arm 3. Arm 3 and weight 4 can vibrate in the X-Y plane by applying voltages having opposite phases to two driving parts 5. According to Embodiment 1, driving parts 5 are of a piezoelectric type utilizing piezoelectric material, such as lead zirconate titanate (PZT), but may be of an electrostatic method utilizing an electrostatic capacitance between electrodes.

Figure 2:
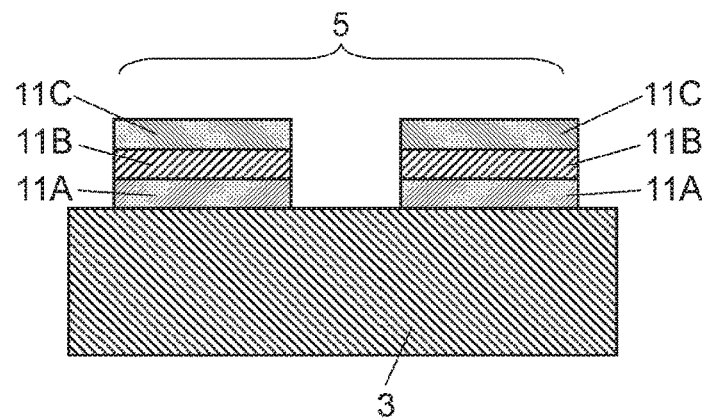
FIG. 2 is a cross-sectional view of the sensor element along line 2-2 shown in FIG. 1.

FIG. 2 is a cross-sectional view of sensor element 1 along line 2-2 shown in FIG. 1, and depicts driving parts 5. Each of driving parts 5 includes lower electrode 11A disposed on arm 3, piezoelectric element 11B disposed on lower electrode 11A, and upper electrode 11C disposed on piezoelectric element 11B, thus allowing piezoelectric element 11B to be sandwiched between lower electrode 11A and upper electrode 11C. Lower electrodes 11A and upper electrodes 11C may be made of any of platinum (Pt), gold (Au), aluminum (Al), and an alloy or an oxide containing mainly any of the above materials. Lower electrodes 11A may be preferably made of platinum (Pt) so that the PZT can be oriented into one direction. A reference potential is applied to lower electrodes 11A. Arm 3 can vibrate in the X-Y plane by applying an alternating-current (AC) driving voltages having opposite phases to upper electrodes 11C. Alternatively, the AC driving voltages may be applied to both lower electrodes 11A and upper electrodes 11C instead of applying the reference potential to lower electrodes 11A. This enables arm 3 and weight 4 to vibrate with larger amplitude, and improves the driving efficiency.

Each of two sensing parts 6 is located on arm portion 3F at respective one of an inner side and an outer side of the J-shape of arm 3. Sensing parts 6 detect vibration of weight 4 by sensing a deformation produced when an angular velocity is applied to arm 3. Sensing part 6 is of a piezoelectric type utilizing piezoelectric elements, but may be of an electrostatic type utilizing an electrostatic capacitance between electrodes. In the case that sensing part 6 is of the piezoelectric type utilizing piezoelectric elements, the piezoelectric element can be formed into a structure similar to that of driving parts 5 in which the piezoelectric element is sandwiched between a lower electrode and an upper electrode.

An operation of the angular velocity sensor according to Embodiment 1 will be described below.

Figure 3:
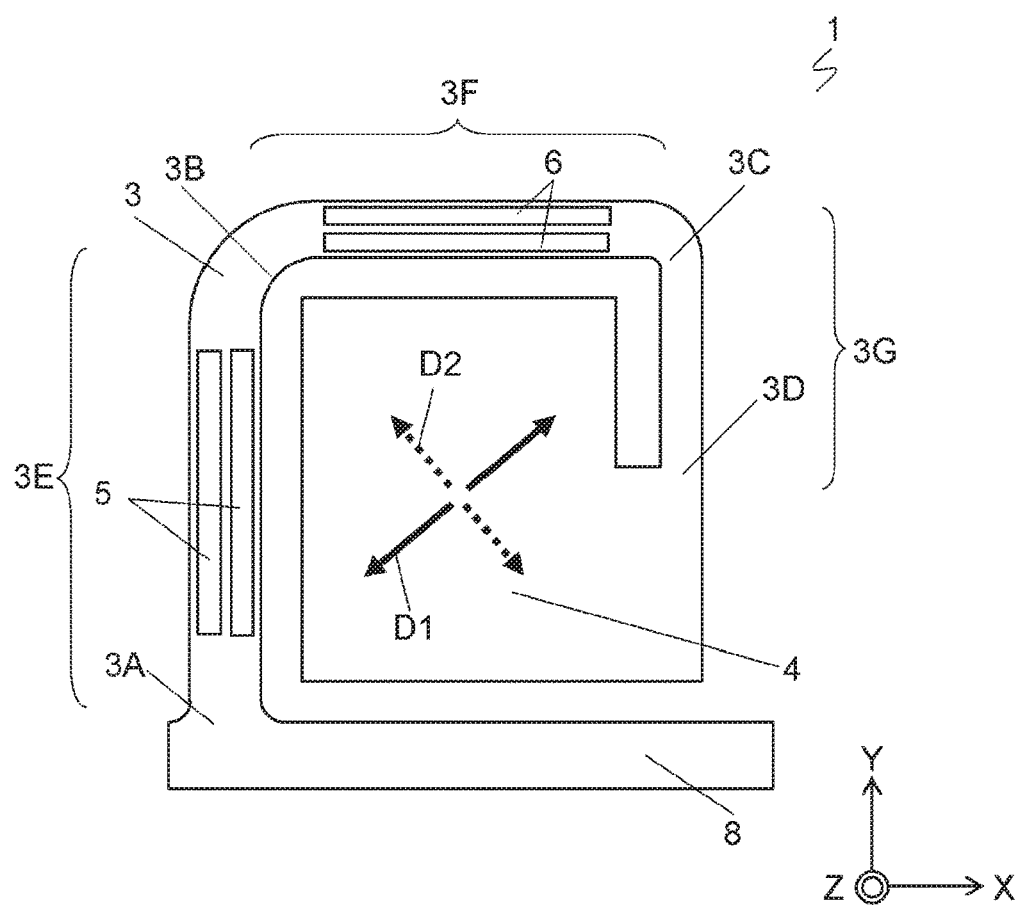
FIG. 3 is a top view of the sensor element according to Embodiment 1 for illustrating driving vibration and detection vibration of the sensor element.

FIG. 3 is a top view of sensor element 1 for illustrating driving vibration and detection vibration of sensor element 1. When an AC voltage having a resonance frequency of the driving vibration is applied to driving parts 5 from an external drive circuit, arm 3 and weight 4 are driven to vibrate along direction D1 of driving vibration in the X-Y plane. When an angular velocity about the Z axis is applied in this vibrating state, the angular velocity produces a Coriolis force in a direction orthogonal to the direction D1 of the driving vibration. The Coriolis force produces a detection vibration on weight 4 in the direction D2 in synchronization with the driving vibration. The angular velocity is hence detected by allowing sensing parts 6 to detect a distortion of arm 3 caused by the detection vibration as a deformation of arm 3.

The resonance frequency of the detection vibration in the direction D2 of detection vibration may be preferably close to the resonance frequency of the driving vibration in the direction D1 of driving vibration. Since the detection vibration generated due to the angular velocity is synchronized with the driving vibration, the resonance frequency of the detection vibration close to the resonance frequency of the driving vibration increases a large amount of the detection vibration accordingly.

It is generally difficult to make a resonance frequency of the driving vibration close to a resonance frequency of the detection vibration since the direction D1 of the driving vibration is different from the direction D2 of the detection vibration, as shown in FIG. 3. For example, if a resonance frequency of driving vibration of conventional sensor element 101 shown in FIG. 11 is designed to be about 40 kHz, a resonance frequency of the detection vibration becomes about 65 kHz, so that these resonance frequencies separate apart from each other by 25 kHz. This decreases the sensibility of conventional sensor element 101 to angular velocity about the Z axis.

In sensor element 1 according to Embodiment 1, length W1 of arm 3 in the direction of the X axis is larger than length W2 of the weight in the direction of the X axis, as shown in FIG. 1. This structure decreases the rigidity of a portion of arm 3 at corner 3C. Since a stress is likely to concentrate into corner 3C during resonance of detection vibration when the angular velocity about the Z axis is applied, this structure lowers the resonance frequency of the detection vibration due to such a small rigidity at corner 3C when the angular velocity about the Z axis is applied. In sensor element 1 according to Embodiment 1, the resonance frequency of the detection vibration can be designed to about 45 kHz against the resonance frequency of 40 kHz of the driving vibration, thereby reducing a difference in the resonance frequencies by 5 kHz. As a result, the sensor can have a sensibility to angular velocity around the Z axis five times more than conventional sensor element 1.

Width WF of arm portion 3F in the direction of the Y axis is preferably smaller than width WE of arm portion 3E in the direction of the X axis, as shown in FIG. 1. This configuration can make the resonance frequency of the driving vibration close to the resonance frequency of the detection vibration since it decreases the rigidity around corner 3C. In addition, width WG of arm portion 3G in the direction of the X axis may be smaller than width WF of arm portion 3F in the direction of the Y axis. Those configuration makes the resonance frequency of the driving vibration close to the resonance frequency of the detection vibration since this also decreases the rigidity around corner 3C. Furthermore, a radius of curvature of an inner circumference of corner 3B may be larger than a radius of curvature of an inner circumference of corner 3C. This configuration also makes the resonance frequency of the driving vibration close to the resonance frequency of the detection vibration since this can also decrease the rigidity around corner 3C. Although any of these configurations provides an effect even when used individually, they can make the resonance frequency of the driving vibration close to the resonance frequency of the detection vibration if combined together, thereby further increasing the sensibility to the angular velocity about the Z axis.

The distortion tends to concentrate on arm portion 3E when arm 3 and weight 4 are driven to vibrate in the direction D1 of driving vibration shown in FIG. 3. Therefore, the driving efficiency can be improved by disposing driving parts 5 to arm portion 3E.

Similarly, the distortion tends to concentrate on arm portion 3F when arm 3 and weight 4 vibrate in the direction D2 of detection vibration shown in FIG. 3. Therefore, the detection efficiency can be improved by disposing sensing parts 6 to arm portion 3F.

End 3D of arm 3 is connected with substantially the center of weight 4 in the direction of the Y axis.

In addition, end 3D of arm 3 is connected with an end of weight 4 in the positive direction X1 of the X axis. This structure can reduce the size of sensor element 1 since weight 4 can be fitted in the J-shape of arm 3.

Exemplary Embodiment 2

Figure 4:
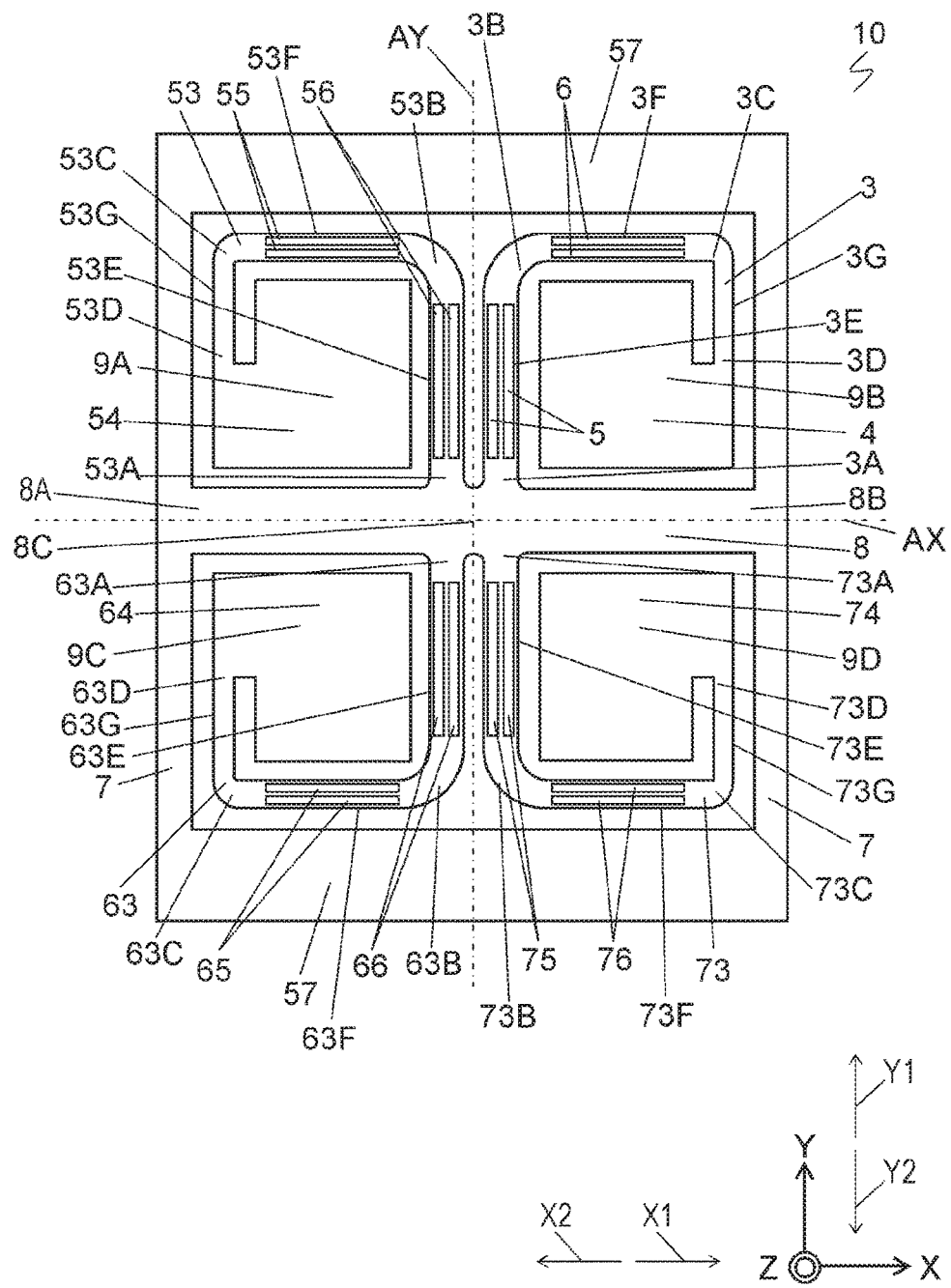
FIG. 4 is a top view of a sensor element of an angular velocity sensor according to Exemplary Embodiment 2.

FIG. 4 is a top view of sensor element 10 of an angular velocity sensor according to Exemplary Embodiment 2. In FIG. 4, components identical to those of sensor element 1 shown in FIGS. 1 to 3 are denoted by the same reference numerals.

The angular velocity sensor according to Embodiment 2 includes sensor element 10 for detecting an angular velocity. Sensor element 10 includes two longitudinal beams 7 extending in a direction of a Y axis, support body 8 constituting a lateral beam extending in a direction of X axis, vibrating units 9A and 9B located in positive direction Y1 of the Y axis from support body 8, and vibrating units 9C and 9D located in negative direction Y2 of the Y axis from support body 8. Each of two ends 8A and 8B of support body 8 is connected with respective one of substantially center portions of two longitudinal beams 7.

Vibrating unit 9B includes arm 3 connected with a side surface of support body 8 and weight 4 connected with end 3D of arm 3, similarly to sensor element 1 according to Embodiment 1 shown in FIGS. 1 to 3. Similarly to Embodiment 1, the length of arm 3 in the direction of the X axis is larger than the length of weight 4 in the direction of the X axis. Vibrating unit 9A includes arm 53 connected with support body 8 and weight 54 connected with arm 53. Vibrating unit 9C includes arm 63 connected with support body 8 and weight 64 connected with arm 63. Vibrating unit 9D includes arm 73 connected with support body 8 and weight 74 connected with arm 73. Arms 53, 63, and 73 have shapes similar to arm 3 according to Embodiment 1 shown in FIG. 1. Arms 3, 53, 63, and 73 are connected with middle portion 8C located at the center of support body 8. Weights 54, 64, and 74 have shapes similar to weight 4 according to Embodiment 1 shown in FIG. 1.

That is, arm 53 has end 53A connected with middle portion 8C of support body 8, and has end 53D opposite to end 53A. Weight 54 is connected with end 53D of arm 53. Arm 53 has substantially s J-shape including arm portion 53E extending in positive direction Y1 of the Y axis from end 53A to corner 53B, arm portion 53F extending in negative direction X2 of the X axis from corner 53B to corner 53C, and arm portion 53G extending in negative direction Y2 of the Y axis from corner 53C to end 53D. The length of arm 53 in the direction of the X axis is larger than the length of weight 54 in the direction of the X axis. The width of arm portion 53F in the direction of the Y axis is smaller than the width of arm portion 53E in the direction of the X axis. The width of arm portion 53G in the direction of the X axis is smaller than the width of arm portion 53F in the direction of the Y axis. A radius of curvature of an inner circumference of corner 53B is larger than a radius of curvature of an inner circumference of corner 53C.

Similarly, arm 63 has end 63A connected with middle portion 8C of support body 8 and has end 63D opposite to end 63A. Weight 64 is connected with end 63D of arm 63. Arm 63 has substantially a J-shape including arm portion 63E extending in negative direction Y2 of the Y axis from end 63A to corner 63B, arm portion 63F extending in negative direction X2 of the X axis from corner 63B to corner 63C, and arm portion 63G extending in positive direction Y1 of the Y axis from corner 63C to end 63D. The length of arm 63 in the direction of the X axis is larger than the length of weight 64 in the direction of the X axis. The width of arm portion 63F in the direction of the Y axis is smaller than the width of arm portion 63E in the direction of the X axis. The width of arm portion 63G in the direction of the X axis is smaller than the width of arm portion 63F in the direction of the Y axis. A radius of curvature of an inner circumference of corner 63B is larger than a radius of curvature of an inner circumference of corner 63C.

Similarly, arm 73 has end 73A connected with middle portion 8C of support body 8 and has end 73D opposite to end 73A. Weight 74 is connected with end 73D of arm 73. Arm 73 has substantially a J-shape including arm portion 73E extending in negative direction Y2 of the Y axis from end 73A to corner 73B, arm portion 73F extending in positive direction X1 of the X axis from corner 73B to corner 73C, and arm portion 73G extending in positive direction Y1 of the Y axis from corner 73C to end 73D. The length of arm 73 in the direction of the X axis is larger than the length of weight 74 in the direction of the X axis. The width of arm portion 73F in the direction of the Y axis is smaller than the width of arm portion 73E in the direction of the X axis. The width of arm portion 73G in the direction of the X axis is smaller than the width of arm portion 73F in the direction of the Y axis. A radius of curvature of an inner circumference of corner 73B is larger than a radius of curvature of an inner circumference of corner 73C.

End 3D of arm 3 is connected with a substantial center of weight 4 within a width of weight 4 in the direction of the Y axis. Similarly, each of arms 53, 63, and 73 is connected with respective one of substantial centers of weights 54, 64, and 74 in the direction of the Y axis.

Driving part 55 and sensing part 56 are disposed to arm portion 53E and arm portion 53F of arm 53, respectively, similarly to driving parts 5 and sensing parts 6 according to Embodiment 1 shown in FIGS. 1 and 2. Driving parts 55 drive arm 53 to vibrate arm 53 and weight 54 in an X-Y plane. Sensing parts 56 detect vibration of weight 54 by sensing the vibration of arm 53. Driving part 65 and Sensing part 66 are disposed to arm portion 63E and arm portion 63F of arm 63, respectively, similarly to driving parts 5 and sensing parts 6 according to Embodiment 1 shown in FIGS. 1 and 2. Driving parts 65 drive arm 63 to vibrate arm 63 and weight 64 in the X-Y plane. Sensing parts 66 detect vibration of weight 64 by sensing the vibration of arm 63. Driving part 75 and sensing part 76 are disposed to arm portion 73E and arm portion 73F of arm 73, respectively, similarly to driving parts 5 and sensing parts 6 according to Embodiment 1 shown in FIGS. 1 and 2. Driving parts 75 drive arm 73 to vibrate arm 73 and weight 74 in the X-Y plane. Sensing parts 76 detect vibration of weight 74 by sensing the vibration of arm 73.

Four vibrating units 9A, 9B, 9C and 9D are symmetrical to each other with respect to the X axis and the Y axis. In other words, vibrating unit 9A is symmetrical to vibrating unit 9B with respect to center axis AY that extends in parallel to the Y axis and through middle portion 8C of support body 8. Vibrating unit 9C is symmetrical to vibrating unit 9 with respect to center axis AY. In addition, vibrating unit 9A is symmetrical to vibrating unit 9C with respect to center axis AX that extends in parallel to the X axis and through middle portion 8C of support body 8. Vibrating unit 9B is symmetrical to vibrating unit 9D with respect to center axis AX.

Two longitudinal beams 7 are fixing members that support sensor element 10, and they are fixed to a package storing sensor element 10 with, e.g. another supporting member or adhesive. Sensor element 10 may include two lateral beams 57 each of which is connected with respective one of ends of two longitudinal beams 7, as shown in FIG. 4. Two longitudinal beams 7 and two lateral beams 57 constitute a fixing member having a frame shape.

Arms 3 and 73 are connected with ends of weights 4 and 74 in positive direction X1 of the X axis, respectively. Arms 53 and 63 are connected with ends of weights 54 and 64 in negative direction X2 of the X axis, respectively. This structure provides sensor element 10 with a small size since weights 4, 54, 64, and 74 can be fitted within the J-shapes of arms 3, 53, 63, and 73, respectively. This structure can reduce the size of the frame shape composed of two longitudinal beams 7 and two lateral beams 57.

Support body 8 connecting longitudinal beams 7 with vibrating units 9A to 9D is preferably connected between center parts of longitudinal beams 7 in consideration of the symmetry. Longitudinal beams 7 and support body 8, upon being formed unitarily, can be manufactured efficiently with the same material as vibrating units 9A to 9D similarly to Embodiment 1.

Figure 5:
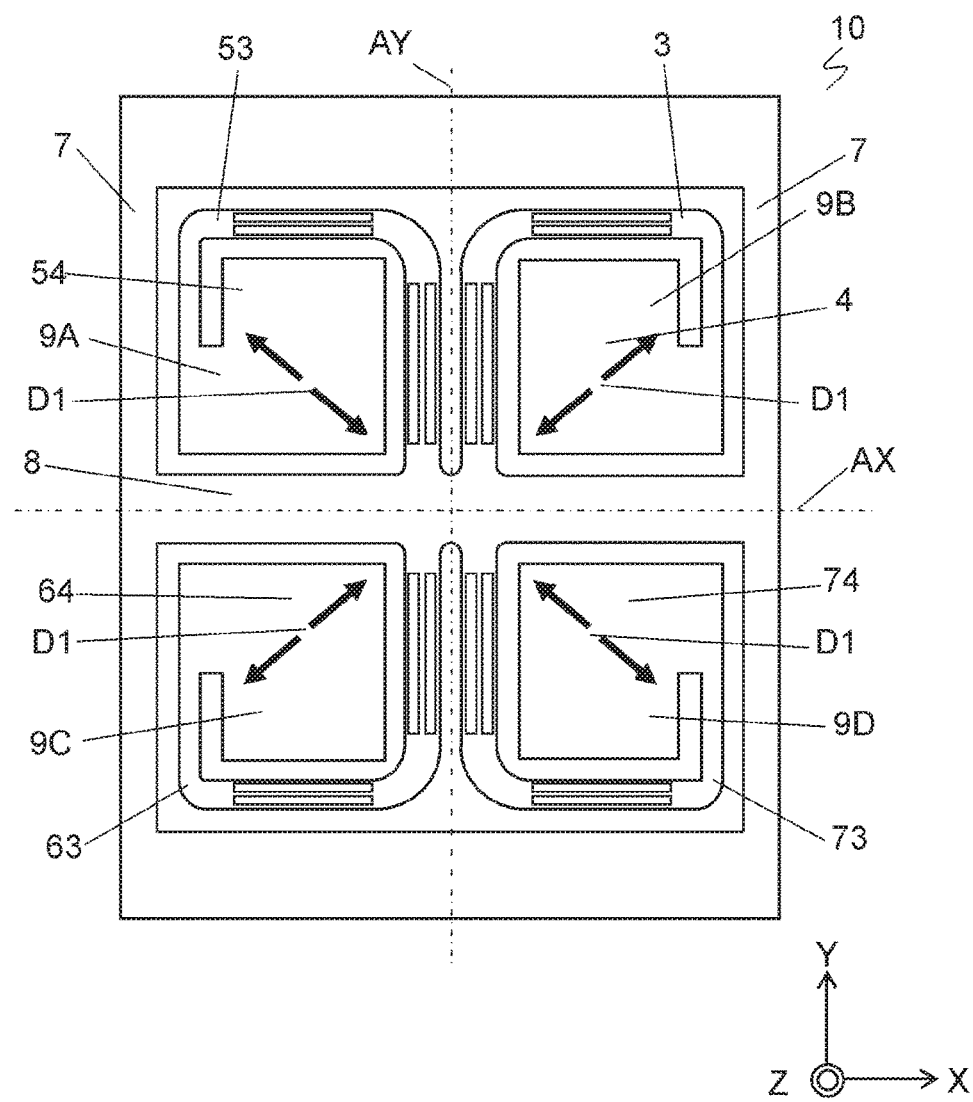
FIG. 5 is a top view of the sensor element according to Embodiment 2 for illustrating driving vibration of the sensor element.

FIG. 5 is a top view of sensor element 10 for illustrating driving vibration of sensor element 10. In vibrating units 9A to 9D of sensor element 10, an AC signal applied to each of driving parts 5, 55, 65, and 75 drives arms 3, 53, 63, and 73 to vibrate in the directions D1 of driving vibration, thereby vibrating weights 4, 54, 64, and 74 in direction D1 of driving vibration in the X-Y plane. Vibrations of four vibrating units 9A to 9D in the X-Y plane cancel each other, as shown in FIG. 5, so as to reduce a level of vibration that leaks out of sensor element 10. Theoretically, the leakage vibration can be eliminated completely by designing vibrating units 9A to 9D, longitudinal beams 7, and support body 8, in particular, such that they are symmetrical with respect to center axes AX and AY. This configuration can prevent sensing parts 6 from picking up undesired signals from, in addition to avoiding a decrease in the Q value of driving vibration attributable to the leakage vibration.

As discussed above, sensor element 10 including four vibrating units 9A to 9D provides an angular velocity sensor having a high driving efficiency and high accuracy as it is less likely to pick up undesired signals since it can avoid a decrease in the Q value of vibration.

Exemplary Embodiment 3

Figure 6:
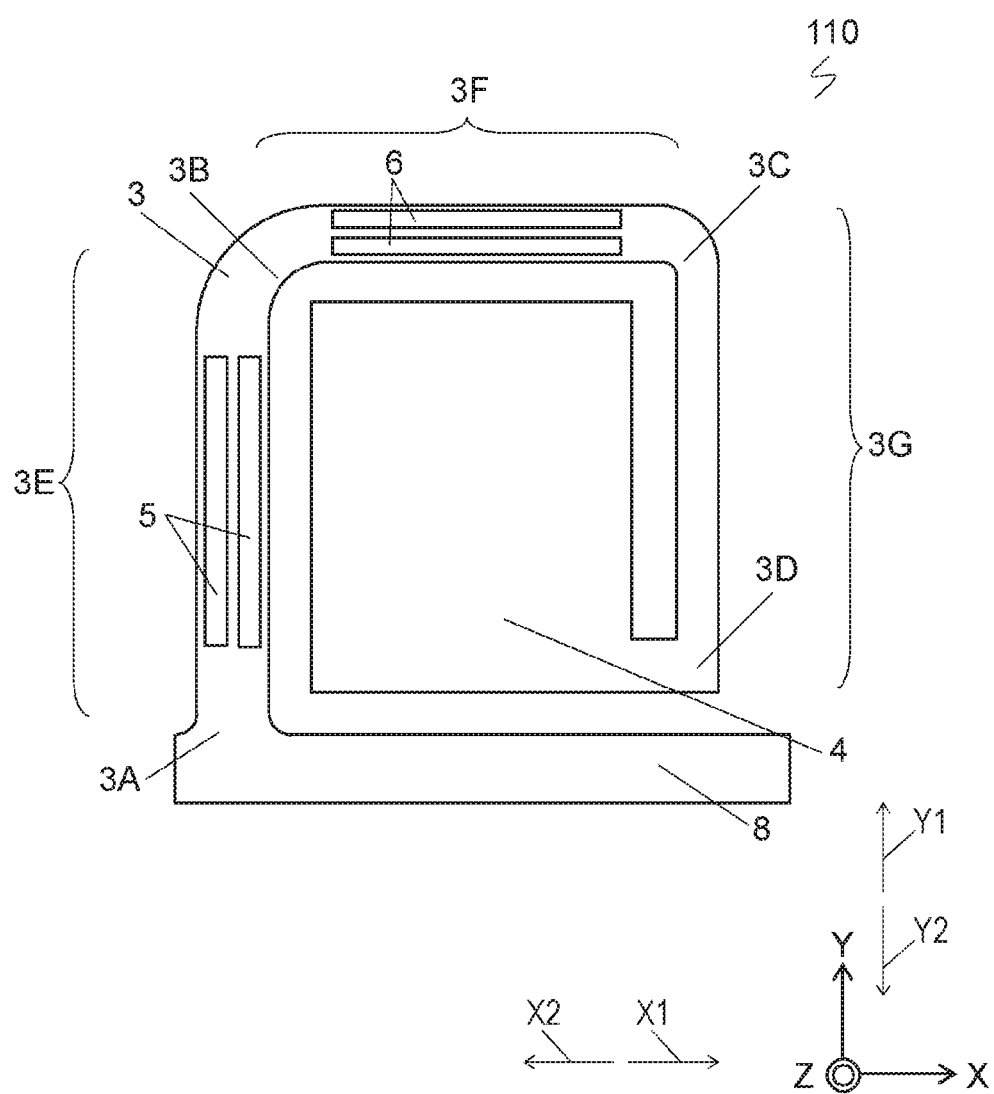
FIG. 6 is a top view of a sensor element of an angular velocity sensor according to Exemplary Embodiment 3.

FIG. 6 is a top view of sensor element 110 of an angular velocity sensor according to Exemplary Embodiment 3. In FIG. 6, components identical to those of sensor element 1 according to Embodiment 1 shown in FIG. 1 are denoted by the same reference numerals.

In sensor element 1 according to Embodiment 1 shown in FIG. 1, end 3D of arm 3 is connected with a substantial center of a width of weight 4 in the direction of the Y axis.

In sensor element 110 according to Embodiment 3 shown in FIG. 6, end 3D of arm 3 is connected with an end of weight 4 in negative direction Y2 of the Y axis. This configuration can increase a length of arm portion 3G extending in the direction of the Y axis from corner 3C to end 3D to longer than a half of a width of weight 4 in the direction of the Y axis. This configuration can make a resonance frequency of driving vibration close to a resonance frequency of detection vibration, thereby increasing amplitude of detection vibration, and improving the sensibility of the angular velocity sensor to an angular velocity about the Z axis.

Figure 7:
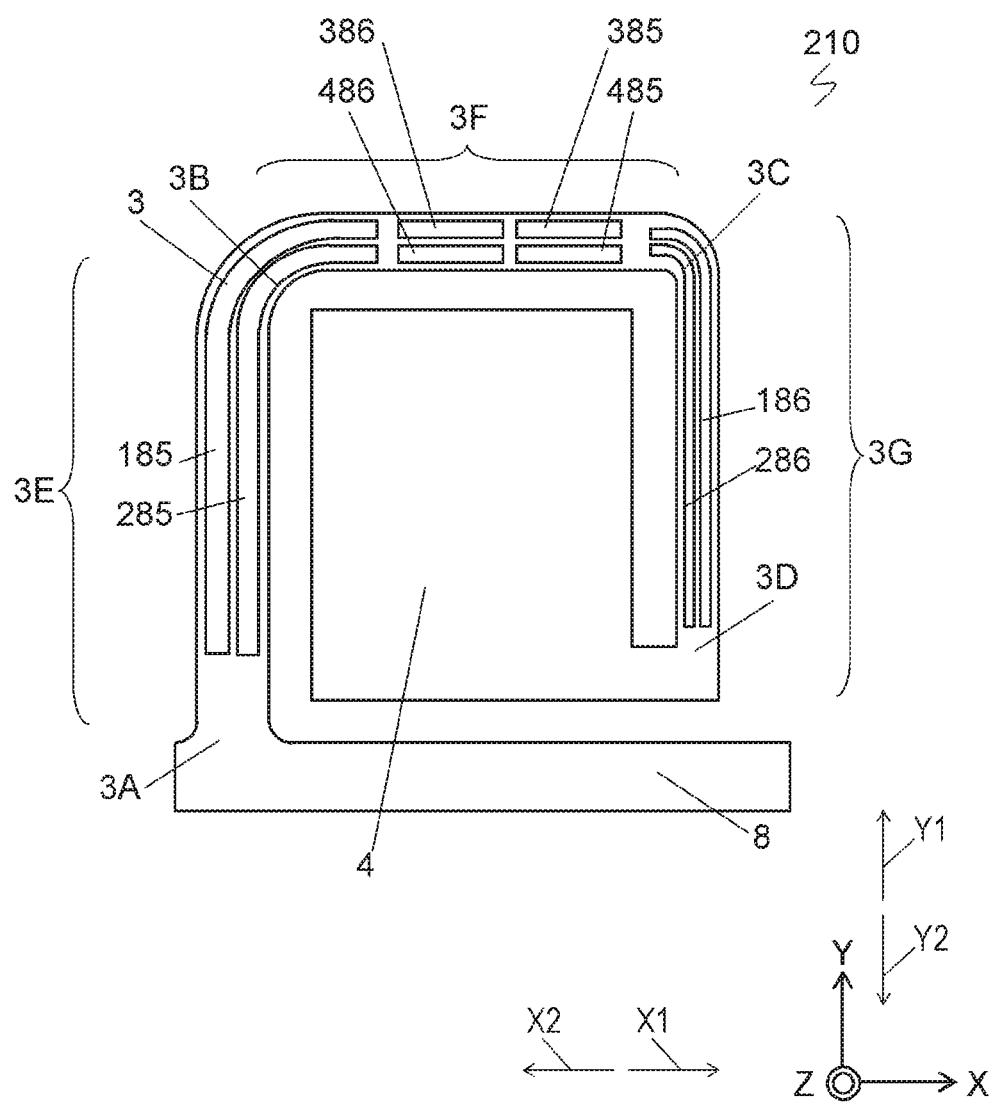
FIG. 7 is a top view of another sensor element of another angular velocity sensor according to Embodiment 3.

FIG. 7 is a top view of another sensor element 210 of the angular velocity sensor according to Embodiment 3. In FIG. 7, components identical to those of sensor element 110 shown in FIG. 6 are denoted by the same reference numerals. Sensor element 210 shown in FIG. 7 includes driving parts 185, 285, 385, and 485, sensing parts 186, 286, and 486 instead of driving parts 5 and sensing parts 6 of sensor element 110 shown in FIG. 6, and further includes monitoring part 386. Driving parts 185, 285, 385, and 485, sensing parts 186, 286, and 486, and monitoring part 386 have structures similar to driving parts 5 according to Embodiment 1 shown in FIG. 2.

Driving parts 185 and 285 extend along arm 3 from the vicinity of end 3A up to arm portion 3F through arm portion 3E and beyond corner 3B of arm 3. Driving part 185 is disposed to an outer side of the J-shape of arm 3. Driving part 285 is located inner than driving part 185 along the J-shape. Sensing parts 186 and 286 extend along arm 3 from the vicinity of end 3D up to arm portion 3F through arm portion 3G and beyond corner 3C of arm 3. Sensing part 186 is disposed to an outer side of the J-shape of arm 3. Sensing part 286 is located inner than sensing part 186 along the J-shape.

Driving parts 385 and 485 are disposed to arm portion 3F along arm portion 3F. Driving part 385 is disposed to an outer side of the J-shape of arm 3. Driving part 485 is located inner than driving part 385 along the J-shape. Monitoring part 386 and sensing part 486 are disposed to arm portion 3F along arm portion 3F. Monitoring part 386 is disposed to an outer side of the J-shape of arm 3. Sensing part 486 is located inner than monitoring part 386 along the J-shape. Driving part 385 and monitoring part 386 are located between driving part 185 and sensing part 186, while driving part 485 and sensing part 486 are located between driving part 285 and sensing part 286. Monitoring part 386 is located between driving part 185 and driving part 385, while sensing part 486 is located between driving part 285 and driving part 485.

Driving parts 185, 285, 385 and 485 operate similarly to driving parts 5 shown in FIG. 1. Sensing parts 186, 286 and 486 operates similarly to sensing parts 6 shown in FIG. 1. Monitoring part 386 outputs a signal synchronized with driving vibration of weight 4. A drive circuit controls an AC voltage applied to driving parts 185, 285, 385, and 485 according to the signal so that weight 4 is driven to vibrate with constant amplitude at a constant frequency. Sensor element 210 can stably detect an angular velocity about the Z axis sensibly.

Exemplary Embodiment 4

Figure 8:
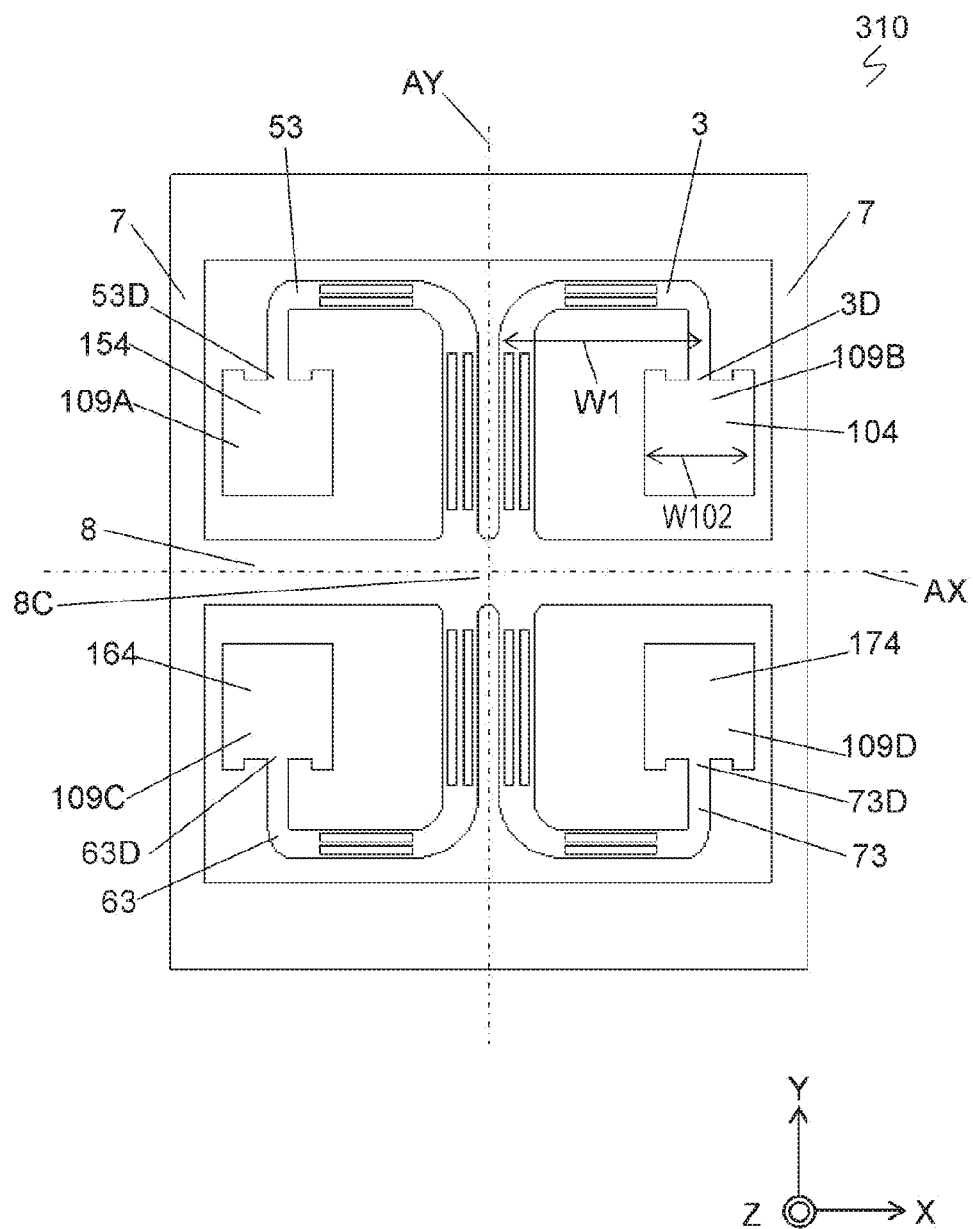
FIG. 8 is a top view of a sensor element of an angular velocity sensor according to Exemplary Embodiment 4.

FIG. 8 is a top view of sensor element 310 of an angular velocity sensor according to Exemplary Embodiment 4. In FIG. 8, components identical to those of sensor element 10 according to Embodiment 2 shown in FIG. 4 are denoted by the same reference numerals.

Sensor element 310 shown in FIG. 8 includes weights 104, 154, 164, and 174 instead of weights 4, 54, 64, and 74 of sensor element 10 according to Embodiment 2 shown in FIG. 4. Weights 104, 154, 164, and 174 are connected with ends 3D, 53D, 63D, and 73D of arms 3, 53, 63, and 73 at center parts in a direction of the X axis of weights 104, 154, 164 and 174, respectively. Length W1 of arm 3 (53, 63, 73) in the direction of the X axis is larger than length W102 of weight 104 (154, 164, 174) in the direction of the X axis.

Arms 53, 3, 63, and 73 and weights 154, 104, 164, and 174 constitute vibrating units 109A, 109B, 109C, and 109D, respectively. Four vibrating units 109A, 109B, 109C, and 109D are symmetrical to each other with respect to the X axis and the Y axis. In other words, vibrating unit 109A is symmetrical to vibrating unit 109B with respect to center axis AY that extends in parallel to the Y axis and through middle portion 8C of support body 8. Vibrating unit 109C is symmetrical to vibrating unit 109D with respect to center axis AY. Vibrating unit 109A is symmetrical to vibrating unit 109C with respect to center axis AX that extends in parallel to the X axis and through middle portion 8C of support body 8. Vibrating unit 109B is symmetrical to vibrating unit 109D with respect to center axis AX.

Sensor element 310 has a similar effect as the sensor element according to Embodiment 2 in sensibility to an angular velocity about the Z axis.

Figure 9:
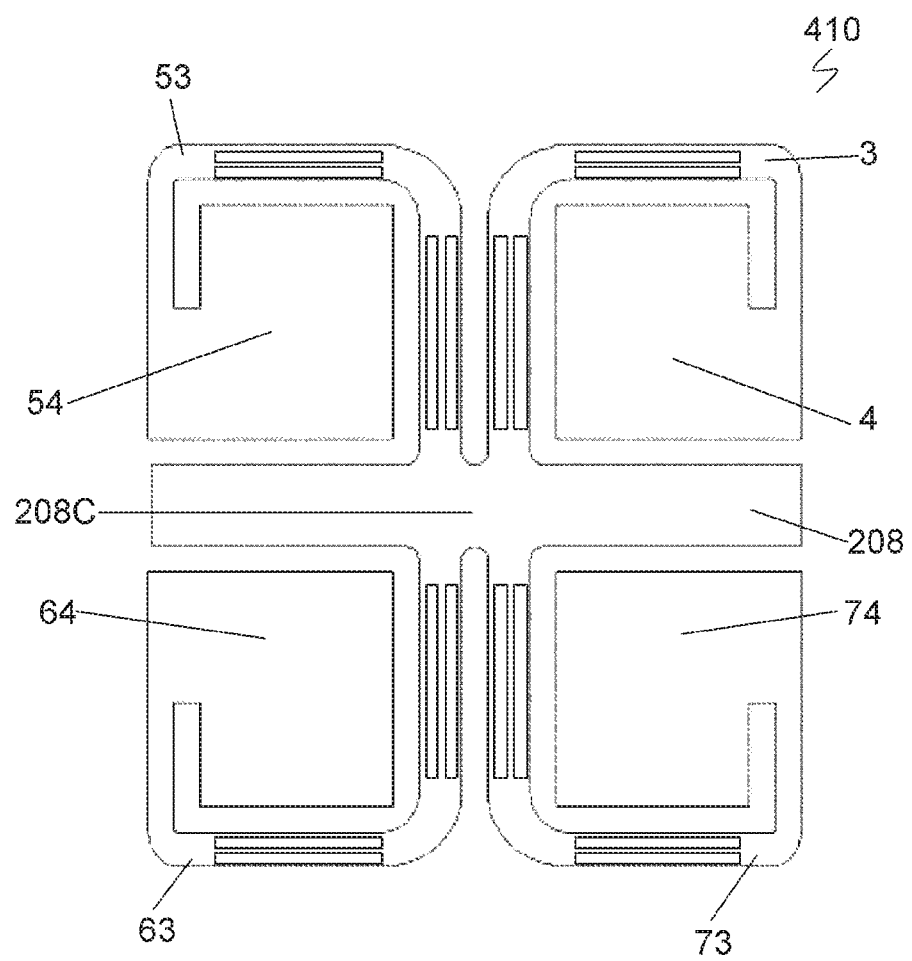
FIG. 9 is a top view of another sensor element of the angular velocity sensor according to Embodiment 4.

FIG. 9 is a top view of sensor element 410 of another angular velocity sensor according to Embodiment 4. In FIG. 9, components identical to those of sensor element 10 according to Embodiment 2 shown in FIG. 4 are denoted by the same reference numerals.

Sensor element 410 shown in FIG. 9 includes support body 208 instead of support body 8 of sensor element 10 shown in FIG. 4, and does not include two longitudinal beams 7 and two lateral beams 57 of sensor element 10 shown in FIG. 4. Sensor element 10 shown in FIG. 4 is supported by the fixing member having the frame shape constituted by two longitudinal beams 7 and two lateral beams 57. Sensor element 410 shown in FIG. 9 is supported by support body 208 which is supported with a fixing member. Arms 3, 53, 63, and 73 are connected to middle portion 208C of support body 208. The width of support body 208 shown in FIG. 9 in the direction of the Y axis is larger than that of support body 8 shown in FIG. 4. This structure securely supports sensor element 410 including four arms 3, 53, 63, and 73, and four weights 4, 54, 64, and 74.

Figure 10:
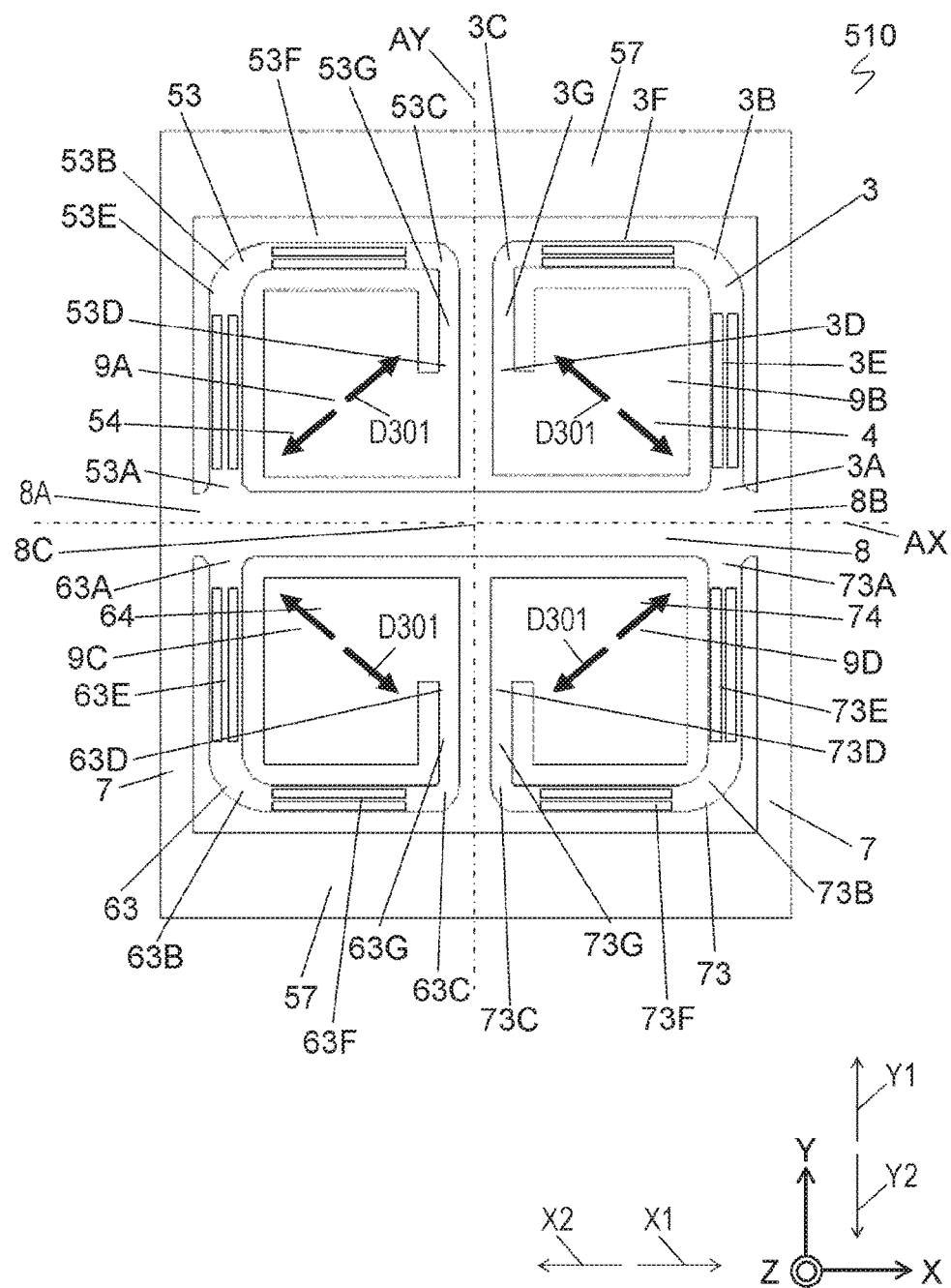
FIG. 10 is a top view of still another sensor element of the angular velocity sensor according to Embodiment 4.

FIG. 10 is a top view of sensor element 510 of a further angular velocity sensor according to Embodiment 4. In FIG. 10, components identical to those of sensor element 10 according to Embodiment 2 shown in FIG. 4 are denoted by the same reference numerals.

In sensor element 10 shown in FIG. 4, ends 3A, 53A, 63A and 73A of arms 3, 53, 63 and 73 are connected with middle portion 8C of support body 8. In sensor element 510 shown in FIG. 10, ends 53A and 63A of arms 53 and 63 are connected with end portion 8A of support body 8 connected with longitudinal beam 7, and ends 3A and 73A of arms 3 and 73 are connected to end portion 8B of support body 8 connected with longitudinal beam 7.

In sensor element 510 shown in FIG. 10, the J-shapes of arms 3, 53, 63 and 73 are inverted forms of those of sensor element 10 shown in FIG. 4. In other words, arm 53 has substantially a J-shape including arm portion 53E extending in positive direction Y1 of the Y axis from end 53A to corner 53B, arm portion 53F extending in positive direction X1 of the X axis from corner 53B to corner 53C, and arm portion 53G extending in negative direction Y2 of the Y axis from corner 53C to end 53D. Arm 3 has substantially a J-shape including arm portion 3E extending in positive direction Y1 of the Y axis from end 3A to corner 3B, arm portion 3F extending in negative direction X2 of the X axis from corner 3B to corner 3C, and arm portion 3G extending in negative direction Y2 of the Y axis from corner 3C to end 3D. Arm 63 has substantially a J-shape including arm portion 63E extending in negative direction Y2 of the Y axis from end 63A to corner 63B, arm portion 63F extending in positive direction X1 of the X axis from corner 63B to corner 63C, and arm portion 63G extending in positive direction Y1 of the Y axis from corner 63C to end 63D. Arm 73 has substantially a J-shape including arm portion 73E extending in negative direction Y2 of the Y axis from end 73A to corner 73B, arm portion 73F extending in negative direction X2 of the X axis from corner 73B to corner 73C, and arm portion 73G extending in positive direction Y1 of the Y axis from corner 73C to end 73D.

In vibrating units 9A to 9D of sensor element 510, an AC signal applied to the driving parts drives and vibrates arms 3, 53, 63 and 73 in the directions D301 of driving vibration, and vibrates weights 4, 54, 64, and 74 in directions D301 of driving vibration in the X-Y plane. Vibrations of four vibrating units 9A to 9D cancel each other in the X-Y plane, as shown in FIG. 10, to reduce a level of vibration that leaks out of sensor element 510. Theoretically, the leakage vibration can be eliminated completely by designing vibrating units 9A to 9D, longitudinal beams 7 and support body 8, in particular, such that they are symmetrical with respect to center axes AX and AY. This configuration can prevent the sensing parts from picking up undesired signals, in addition to avoiding a decrease in the Q value of driving vibration attributable to the leakage vibration.

As discussed above, sensor element 510 shown in FIG. 10 can provide an angular velocity sensor with a high driving efficiency and high accuracy as it is less likely to pick up undesired signals since it can avoid a decrease in the Q value of vibration, similarly to sensor element 10 shown in FIG. 4.

INDUSTRIAL APPLICABILITY

An angular velocity sensor according to the present invention can detect angular velocities sensibly and is applicable to a wide range of uses from a portable terminal to vehicle control.

REFERENCE MARKS IN THE DRAWINGS

1 Sensor Element
3 Arm (First Arm)
3A End (First End)
3B Corner (First Corner)
3C Corner (Second Corner)
3D End (Second End)
3E Arm Portion (First Arm Portion)
3F Arm Portion (Second Arm Portion)
3G Arm Portion (Third Arm Portion)
4 Weight (First Weight)
5 Driving Part (First Driving Part)
6 Sensing Part (First Sensing Part)
7 Longitudinal Beam (First Longitudinal Beam, Second Longitudinal Beam)
8 Support Body 9A Vibrating Unit (Second Vibrating Unit)
9B Vibrating Unit (First Vibrating Unit)
9C Vibrating Unit (Fourth Vibrating Unit)
9D Vibrating Unit (Third Vibrating Unit)
53 Arm (Second Arm)
53A End (Third End)
53B Corner (Third Corner)
53C Corner (Fourth Corner)
53D End (Fourth End)
53E Arm Portion (Fourth Arm Portion)
53F Arm Portion (Fifth Arm Portion)
53G Arm Portion (Sixth Arm Portion)
54 Weight (Second Weight)
55 Driving Part (Second Driving Part)
56 Sensing Part (Second Sensing Part)
63 Arm (Fourth Arm)
63A End (Seventh End)
63B Corner (Seventh Corner)
63C Corner (Eighth Corner)
63D End (Eighth End)
63E Arm Portion (Tenth Arm Portion)
63F Arm Portion (Eleventh Arm Portion)
63G Arm Portion (Twelfth Arm Portion)
64 Weight (Fourth Weight)
65 Driving Part (Fourth Driving Part)
66 Sensing Part (Fourth Sensing Part)
73 Arm (Third Arm)
73A End (Fifth End)
73B Corner (Fifth Corner)
73C Corner (Sixth Corner)
73D End (Sixth End)
73E Arm Portion (Seventh Arm Portion)
73F Arm Portion (Eighth Arm Portion)
73G Arm Portion (Ninth Arm Portion)
74 Weight (Third Weight)
75 Driving Part (Third Driving Part)
76 Sensing Part (Third Sensing Part)
Ax Center Axis (Second Center Axis)
Ay Center Axis (First Center Axis)

The invention claimed is:

1. A sensor comprising:
a sensor element defined in an XY plane having an X axis and a Y axis that is orthogonal to the X axis, wherein the sensor element including:
a first member,
a second member consisting of a first portion extending from the first member in a positive direction of the Y axis, a second portion extending from the first portion in a positive direction of the X axis and a third portion extending from the second portion in a negative direction of the Y axis, and
a third member consisting of a first section and a second section which has a rectangular shape in a top view,
wherein the first portion, the second portion and the third portion extend along a periphery of the first section in the top view respectively,
wherein the second section is connected to the third portion and extends from the first section in the positive direction of the Y axis,
wherein a width of the second portion along the Y axis is smaller than a width of the first portion along the X axis, and is broader than a width of the third portion along the X axis, and
wherein a length of the second member along the X axis is larger than a length of the third member along the X axis.

2. The sensor according to claim 1, wherein
an end of the third portion is connected substantially at an outer end of the third member in the positive direction of the X axis.
3. The sensor according to claim 1, wherein
an end of the third portion is connected substantially at a center of the third member along the Y axis.
4. The sensor according to claim 1, wherein
the first member extends along a periphery of the first section and the second section in the top view.
5. The sensor according to claim 1, wherein
the sensor element further includes a fourth member connected to the first member, and
wherein the fourth member surrounds the first member, the second member and the third member.
6. The sensor according to claim 1, wherein
the sensor element further includes a fourth member connected to the first member, and surrounding the first member, the second member and the third member,
wherein the first member has two opposite ends, and
wherein each of the two opposite ends are connected to an inner side of the fourth member.
7. The sensor according to claim 1, wherein
the X axis and the Y axis pass at a center of the first member and the sensor element is symmetrically with respect to the X axis and the Y axis.
8. A sensor comprising:
a sensor element defined in an XY plane having an X axis and a Y axis that is orthogonal to the X axis, wherein the sensor element including:
a first member,
a second member consisting of a first portion extending from the first member in a positive direction of the Y axis, a second portion extending from the first portion in a positive direction of the X axis and a third portion extending from the second portion in a negative direction of the Y axis, and
a third member connected to the third portion,
wherein the first portion, the second portion and the third portion extend along a periphery of the third member in a top view respectively,
wherein the third member has six sides in the top view and has a rectangular section extending in the positive direction of the Y axis,
wherein a width of the second portion along the Y axis is smaller than a width of the first portion along the X axis, and is broader than a width of the third portion along the X axis, and
wherein the rectangular section is connected to the third portion.
9. The sensor according to claim 8, wherein
a length of the second member along the X axis is larger than a length of the third member along the X axis.
10. The sensor according to claim 8, wherein
an end of the third portion is connected substantially at an outer end of the third member in the positive direction of the X axis.
11. The sensor according to claim 8, wherein
an end of the third portion is connected substantially at a center of the third member along the Y axis.
12. The sensor according to claim 8, wherein
the first member extends along a periphery of the rectangular section in the top view.
13. The sensor according to claim 8, wherein
the sensor element further includes a fourth member connected to the first member, and surrounding the first member, the second member and the third member.

14. The sensor according to claim 8, wherein
the sensor element further includes a fourth member connected to the first member, and surrounding the first member, the second member and the third member,
wherein the first member has two opposite ends, and
wherein each of the two opposite ends are connected to an inner side of the fourth member.

15. The sensor according to claim 8, wherein
the X axis and the Y axis pass at a center of the first member and the sensor element is symmetrically with respect to the X axis and the Y axis.

16. A sensor comprising:
a sensor element defined in an XY plane having an X axis and a Y axis that is orthogonal to the X axis, wherein the sensor element including:
  a first member,
  a second member consisting of a first portion extending from the first member in a positive direction of the Y axis, a second portion extending from the first portion in a positive direction of the X axis and a third portion extending from the second portion in a negative direction of the Y axis, and
  a third member connected to the third portion,
  wherein the first portion, the second portion and the third portion extend along a periphery of the third member in a top view respectively,
  wherein a width of the second portion along the Y axis is smaller than a width of the first portion along the X axis, and is broader than a width of the third portion along the X axis, and
  wherein a length of the second member is larger than a length of the third member in the positive direction of the X axis.

17. The sensor according to claim 16, wherein
an end of the third portion is connected substantially at an outer end of the third member in the positive direction of the X axis.

18. The sensor according to claim 16, wherein
an end of the third portion is connected substantially at a center of the third member along the Y axis.

19. The sensor according to claim 16, wherein
the sensor element further includes a fourth member connected to the first member, and surrounding the first member, the second member and the third member.

20. The sensor according to claim 16, wherein
the sensor element further includes a fourth member connected to the first member, and surrounding the first member, the second member and the third member,
wherein the first member has two opposite ends, and
wherein each of the two opposite ends are connected to an inner side of the fourth member.

21. The sensor according to claim 16, wherein
the X axis and the Y axis pass at a center of the first member and the sensor element is symmetrically with respect to the X axis and the Y axis.

* * * * *